(12) United States Patent
Baone et al.

(10) Patent No.: US 11,169,189 B2
(45) Date of Patent: Nov. 9, 2021

(54) SYSTEMS AND METHODS FOR OPERATING GENERATORS BASED ON GENERATOR STEADY STATE STABILITY LIMITS

(71) Applicant: General Electric Company, Schenectady, NY (US)

(72) Inventors: Chaitanya Ashok Baone, Niskayuna, NY (US); Khaled Yehia Bahei-Eldin, Niskayuna, NY (US); Anup Menon, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 118 days.

(21) Appl. No.: 16/500,842

(22) PCT Filed: Apr. 10, 2017

(86) PCT No.: PCT/US2017/026833
§ 371 (c)(1),
(2) Date: Oct. 4, 2019

(87) PCT Pub. No.: WO2018/190793
PCT Pub. Date: Oct. 18, 2018

(65) Prior Publication Data
US 2020/0110115 A1    Apr. 9, 2020

(51) Int. Cl.
*G01R 21/133*    (2006.01)
*G01R 19/25*    (2006.01)
*H02J 3/18*    (2006.01)

(52) U.S. Cl.
CPC ..... *G01R 21/1331* (2013.01); *G01R 19/2513* (2013.01); *H02J 3/18* (2013.01)

(58) Field of Classification Search
CPC ............ G01R 21/133; G01R 21/1331; G01R 19/2513; H02J 3/18; H02J 3/24; Y02E 40/30
See application file for complete search history.

(56) References Cited

U.S. PATENT DOCUMENTS

| 3,936,722 A | 2/1976 | Goto et al. |
| 5,708,590 A | 1/1998 | Slutsker et al. |

(Continued)

FOREIGN PATENT DOCUMENTS

| CN | 102185316 B | 4/2013 |
| CN | 103279638 A | 9/2013 |

(Continued)

OTHER PUBLICATIONS

Paul Lerley, Loss-of-Field Protection Relay Coordination for Synchronous Generator and Motor Unit Based on Transient Stability, Oct. 20-22, 2015, 18 pages (Year: 2015).*

(Continued)

*Primary Examiner* — Tung S Lau
(74) *Attorney, Agent, or Firm* — Armstrong Teasdale LLP

(57) ABSTRACT

A generator control computer device for operating at least one generator attached to a grid is provided. The generator control computer device includes at least one processor in communication with at least one memory device. The generator control computer device is configured to receive, from at least one sensor, a plurality of sensor readings representing one or more conditions of the at least one generator, calculate a current grid impedance of the grid based on the plurality of sensor readings, determine a steady state stability limit for the at least one generator based on the current grid impedance, and adjust operation of the at least one generator based on the determined steady state stability limit.

20 Claims, 6 Drawing Sheets

(56) References Cited

U.S. PATENT DOCUMENTS

| | | | |
|---|---|---|---|
| 6,294,898 | B2 | 9/2001 | Lawson et al. |
| 7,710,693 | B2 | 5/2010 | Guzman-Casillas et al. |
| 8,044,672 | B2 | 10/2011 | Williams |
| 10,139,434 | B1* | 11/2018 | McEachern ........ G01R 19/2513 |
| 10,141,869 | B2* | 11/2018 | Redmann .......... H02M 7/53871 |
| 2014/0343881 | A1* | 11/2014 | Johannsson ............ G01R 21/06 702/65 |
| 2015/0005967 | A1* | 1/2015 | Johannsson ............... H02J 3/46 700/287 |
| 2015/0364920 | A1* | 12/2015 | Konopinski ............ H02P 9/105 307/103 |
| 2020/0076338 | A1* | 3/2020 | Alla ...................... G01R 31/343 |

FOREIGN PATENT DOCUMENTS

| | | | | |
|---|---|---|---|---|
| CN | | 103780176 A | 5/2014 | |
| EP | | 2738905 A2 | 6/2014 | |
| JP | | 2008199848 A | 8/2008 | |
| WO | | 2010119136 A1 | 10/2010 | |
| WO | WO 2012163979 A2 * | 12/2012 | ............... H02J 3/18 |
| WO | | 2013087085 A1 | 6/2013 | |

OTHER PUBLICATIONS

Nicholas P. W. Strachan, Stability of a Variable-Speed Permanent Magnet Wind Generator With Weak AC Grids, IEEE Transactions on Power Delivery, vol. 25, No. 4, Oct. 2010, 10 pages (Year: 2010).*

Mozina, Charles J et al., "Coordination of Generator Protection with Generator Excitation Control and Generator Capability; Working Group J-5 of the Rotating Machinery Subcommittee, Power System Relay Committee", Power Engineering Society General Meeting, IEEE, Jun. 24-28, 2007, Tampa, Florida, Paper No. 1-4244-1298-6/07, 17 pp.

Benmouyal, Gabriel, "The Impact of Synchronous Generators Excitation Supply on Protection and Relays", Georgia Tech Protective Relaying Conference, May 2008, 16 pp.

Tianshu Bi et al: "Adaptive loss of fieldprotection based on phasor measurements", Power and Energy Society General Meeting, 2011 IEEE, IEEE, Jul. 24, 2011 (Jul. 24, 2011), pp. 1-4.

International Search Report and Written Opinion, dated Jan. 3, 2018, for related International application No. PCT/US2017/026833.

* cited by examiner

SYSTEMS AND METHODS FOR OPERATING GENERATORS BASED ON GENERATOR STEADY STATE STABILITY LIMITS

BACKGROUND

The field of the disclosure relates generally to generator steady state stability limits and, more particularly, to systems and methods for monitoring steady state stability limits of a generator in real-time and operating the generator based on those limits.

Many power plant generators are used for generating both active and reactive power. However, power plant generators are limited in the amount of active and reactive power that they generate based on a thermal operation constraint limit. The power plant generator is only able to safely produce a specific maximum combination of active and reactive power due to the thermal operation constraint limit.

Many power plant generators are operated in a steady state, where the load on the generator is generally stable. The generators are operated so that the generator is at a steady state limit, the maximum combination of active and reactive power that the power plant generate may safely generate. In many of these cases, the steady state limit is calculated based on a worst case study that determines the worst case impedance of the system that the generator is connected to. However, this level of impedance only occurs in an absolute worst case, such as in the case of a transmission line outage. During normal operation of the generator the impedance is generally significantly lower, which means the generator may not be operating at maximum capacity, particularly in weak grids and for generators located at the end of long transmission lines with little neighboring generation.

BRIEF DESCRIPTION

In one aspect, a generator control computer device for operating at least one generator attached to a grid is provided. The generator control computer device includes at least one processor in communication with at least one memory device. The generator control computer device is configured to receive, from at least one sensor, a plurality of sensor readings representing one or more conditions of the at least one generator, calculate a current grid impedance of the grid based on the plurality of sensor readings, determine a steady state stability limit for the at least one generator based on the current grid impedance, and adjust operation of the at least one generator based on the determined steady state stability limit.

In another aspect, a system is provided. The system includes a generator configured to generate electrical energy. The generator is connected to and provides the generated electrical energy to a power grid. The system also includes at least one sensor configured to monitor at least one condition of the generator and generate signals representing sensor data based on the at least one condition. The system further includes a generator control computer device including a processor and a memory. The generator control computer device is in communication with the at least one sensor. The generator control computer device is configured to control operation of the generator, thereby controlling the flow of electrical energy to the power grid. The generator control computer device is configured to receive a plurality of signals representing sensor data from the at least one sensor, calculate a current grid impedance of the power grid based on the sensor data, determine a steady state stability limit for the generator based on the current grid impedance, and adjust operation of the generator based on the determined steady state stability limit.

In yet another aspect, a method for operating at least one generator attached to a grid is provided. The method is implemented using a generator control computer device that includes a processor in communication with a memory. The method includes receiving, from at least one sensor, a plurality of sensor readings representing one or more conditions of the at least one generator, calculating, by the processor, a current grid impedance of the grid based on the plurality of sensor readings, determining, by the processor, a steady state stability limit for the at least one generator based on the current grid impedance, and adjusting, by the processor, operation of the at least one generator based on the determined steady state stability limit.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Figure 1:
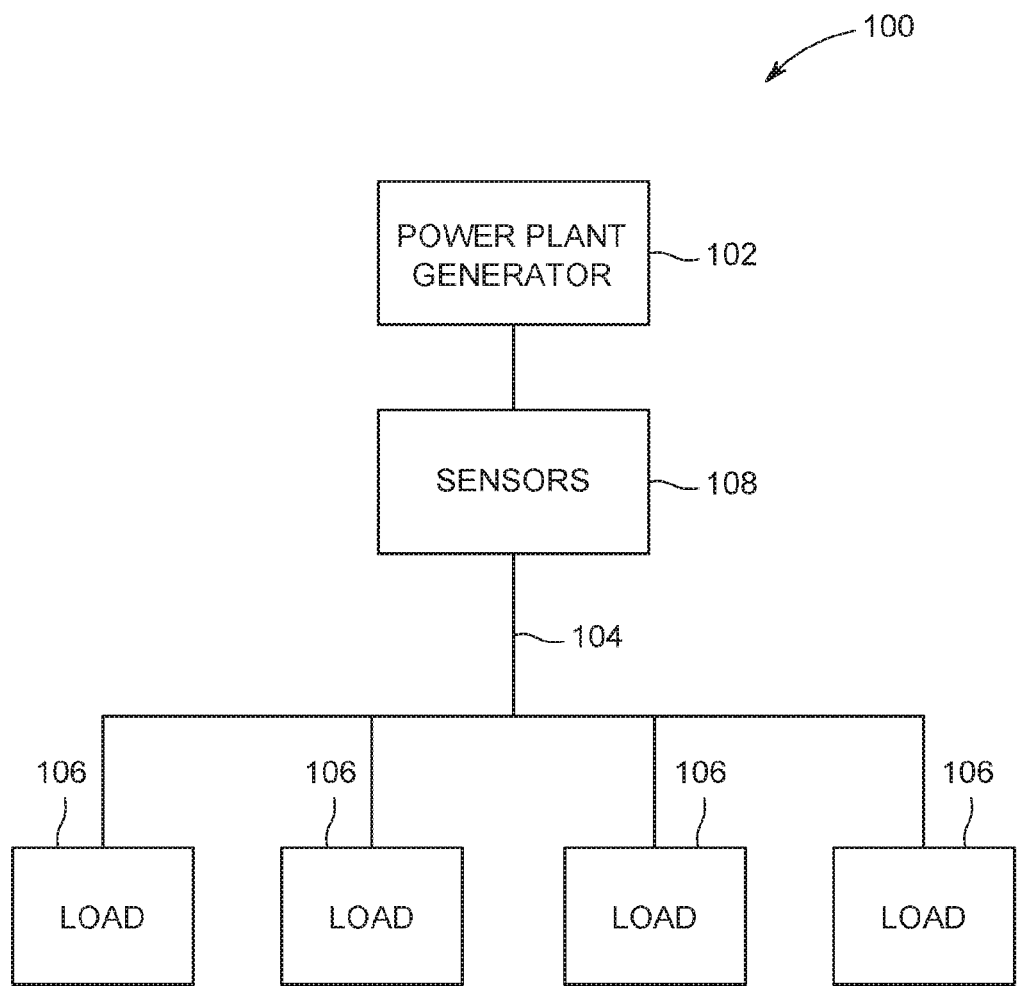
FIG. 1 is a schematic view of a power system for generating and providing power.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer", and related terms, e.g., "processing device", "computing device", and controller" are not limited to just those integrated circuits referred to in the art as a computer, but broadly refers to a microcontroller, a microcomputer, a programmable logic controller (PLC), an application specific integrated circuit, and other programmable circuits, and these terms are used interchangeably herein. In the embodiments described herein, memory may include, but is not limited to, a computer-readable medium, such as a random access memory (RAM), and a computer-readable non-volatile medium, such as flash memory. Alternatively, a floppy disk, a compact disc—read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program stored in memory for execution by personal computers, workstations, clients and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The simulation system described herein provides a method for safely and efficiently operating a generator attached to a power grid. Specifically, the embodiments described herein include a computing device that is configured to monitor the impedance of the grid that the generator is attached to and adjust the operation of the generator based on changes in the monitored impedance. The computing device may use a plurality of methods for determining the impedance, correcting for noise, and detecting data errors. In the exemplary embodiment, the computer device performs these operations in real-time, correcting for current changes in the impedance of the grid to prevent potential generator tripping and providing the maximum power output available.

FIG. 1 is a schematic view of a power system 100 for generating and providing power. Power system 100 includes a power generator 102. In the exemplary embodiment, power generator 102 generates alternating current (AC) electrical energy. Power generator 102 may include, but is not limited to, a battery, a gas engine, a coal fired turbine, a fuel cell, a nuclear generator, a wind turbine, solar cells, a hydroelectric generator, a geothermal tap, and any other device capable of generating energy.

AC Energy from power generator 102 is transmitted, via a power distribution network 104 to a plurality of loads 106. Examples of loads 106 include businesses and residences that consume electrical energy. In some embodiments, loads 106 are connected to power distribution network 104 through a smart meter (not shown). Power distribution network 104 includes equipment, such as, without limitation, a plurality of conduits and switches that facilitate electrical energy being routed to its destination. In the exemplary embodiment, the combination of power distribution network 104 and plurality of loads 106 act as a combination of resistive and capacitive load for power generator 102. Accordingly, power generator 102 is capability of providing both active and reactive power as needed.

In other embodiments, power system 100 may include a plurality of power generators 102. In some of these embodiments, the power generators 102 operate independently of each other. In some further embodiments, some of the power generators 102 work in concert with one another and may be controlled together.

In the exemplary embodiment, one or more sensors 108 are placed between power generator 102 and power distribution network 104. In the exemplary embodiment, sensors 108 measure the current, voltage (such as terminal voltage) and active power of power generator 102 and reactive power is calculated based on the sensor readings. In other embodiments, sensors 108 also directly measure reactive power.

Figure 2:
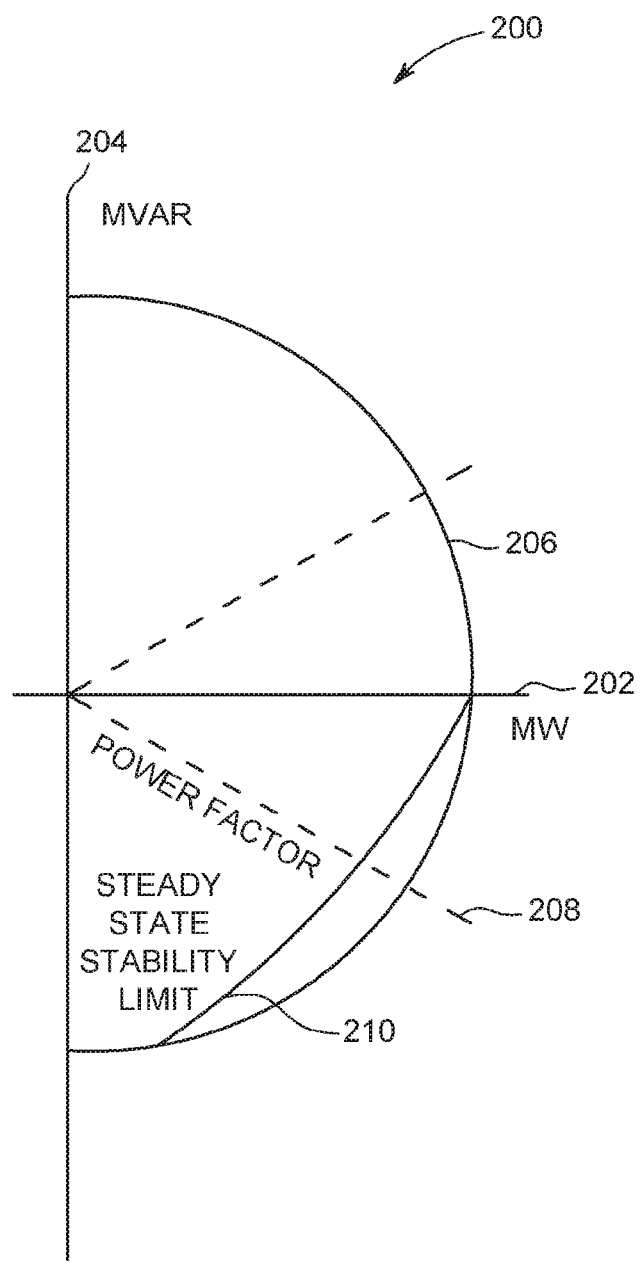
FIG. 2 is a graph of an exemplary reactive power curve for the power plant generator shown in FIG. 1.

FIG. 2 is a graph 200 of an exemplary reactive power curve 206 for power generator 102 (shown in FIG. 1).

As an alternating current (AC) power source, power generator 102 (shown in FIG. 1) generates both active and reactive power. In a simple alternating current (AC) system consisting of a source and a linear load, both the current and voltage are sinusoidal. If the load is purely resistive, the two quantities reverse their polarity at the same time. At every instant, the product of voltage and current is positive or zero, the result being that the direction of energy flow does not reverse. In this case, only active power is transferred. If the load is purely reactive, then the voltage and current are 90 degrees out of phase from each other. For two quarters of each cycle, the product of voltage and current is positive, but for the other two quarters, the product is negative, indicating that on average, exactly as much energy flows into the load as flows back out. In effect, there is no net energy flow over each half cycle.

In the exemplary embodiment, the combination of power distribution network 104 and plurality of loads 106 (both shown in FIG. 1) is both resistive and reactive. Accordingly, the combination has resistance as well as inductance, and/or capacitance. Accordingly both active and reactive power will flow to plurality of loads 106.

Graph 200 illustrates an exemplary reactive power curve 206 (also known as a reactive capability curve). Graph 200 includes a y-axis 204 defining reactive power in mega volt-ampere reactives (MVAR). Graph 200 also includes an x-axis 202 defining active power in megawatts (MW). Graph 200 further includes a power factor 208 and a steady state stability limit 210. In the exemplary embodiment, reactive power curve 206 is based on the attributes of power generator 102 and represents the maximum output of power generator 102. When running at maximum capacity, as power generator 102 increases reactive power output, then power generator 102 must decrease active power output, to prevent tripping of generator 102. Similarly, as power generator 102 increases active power output, power generator 102 must decrease reactive power output.

Power factor 208 represents the ratio between real power and apparent power. Apparent power may be considered the magnitude of the vector sum of active and reactive power. Apparent power is calculated as the product of the root mean square values of voltage and current.

Steady state stability limit 210 represents the calculated steady state limit for power generator 102 connected to the power system 100. If the output (active and reactive power) of power generator 102 is inside of steady state stability limit 210 then generator 102 connected to the grid (i.e., power distribution network 104 and plurality of loads 106) is within a stable steady state. In this condition, small signal changes to the grid, such as minor load changes, would not cause power system 100 or power generator 102 to become unstable. An example of an unstable system would be if the output of power generator 102 was between steady state stability limit 210 and reactive power curve 206. If there were a disturbance on the grid, then power generator 102 may start to oscillate with respect to the grid. Power generator 102 may be unable to recover from the oscillation, and may have to trip offline to prevent damage to power generator 102.

In the exemplary embodiment, steady state stability limit 210 is calculated based on the condition of the grid. These calculations include two factors: the voltage level of power generator 102 and the grid impedance. In some embodiments, grid impedance is calculated prior to generator 102 being attached to the grid. In these embodiments, the grid impedance may be recalculated when there are significant changes to the grid and/or generator 102. In these embodiments, steady state stability limit 210 is static.

In the exemplary embodiment, steady state stability limit 210 is dynamically updated in real-time. In this embodiment, steady state stability limit 210 is adjusted based on current sensor information from sensors 108 (shown in FIG. 1). By adjusting steady state stability limit 210 due to current conditions of the grid, generator 102 is able to operate at full capacity based on current conditions, rather than having to be operated as if the worst-case conditions had occurred.

In some embodiments, grid impedance is estimated as $X_e$ using two data points with measurements of current, reactive power, and voltage at two points in time.

$$(I_2^2 - I_1^2)X_e^2 - 2(Q_2 - Q_1)X_e + V_2^2 - V_1^2 = 0 \quad \text{Eq. 1}$$

where I is current, Q is reactive power, and V is voltage. In some of these embodiments, the grid impedance is filtered using a Kalman Filter. The Kalman Filter state equation is:

$$X_{e,i+1} = X_{e,i} + \omega_p \quad \text{Eq. 2}$$

where $\omega_p$ denotes process noise. The observation equation for the Kalman Filter is:

$$0 = V_{2,i}^2 - (Q_{2,i} - Q_{1,i})X_{e,i} + (I_{2,i}^2 - I_{1,i}^2)X_{e,i}^2 + \omega_m \quad \text{Eq. 3}$$

where i denotes an instant of time and $\omega_m$ denotes measurement noise. The two instants of time need to be carefully selected so that $(V_1, I_1, Q_1)$ is not too close to $(V_2, I_2, Q_2)$; otherwise, $X_e$ may be incorrect.

In the exemplary embodiment, grid impedance is measured using a plurality of state variables $(\hat{V}_{1,i}, \hat{V}_{2,i}, \hat{I}_{1,i}, \hat{I}_{2,i}, \hat{Q}_{1,i}, \hat{Q}_{2,i}, \hat{X}_{e,i})$. The state equations for this estimation include:

$$\hat{V}_{1,i+1} = \hat{V}_{1,i} + \omega_{p1} \quad \text{Eq. 4A}$$

$$\hat{V}_{2,i+1} = \hat{V}_{2,i} + \omega_{p2} \quad \text{Eq. 4B}$$

$$\hat{I}_{1,i+1} = \hat{I}_{1,i} + \omega_{p3} \quad \text{Eq. 4C}$$

$$\hat{I}_{2,i+1} = \hat{I}_{2,i} + \omega_{p4} \quad \text{Eq. 4D}$$

$$\hat{Q}_{1,i+1} = \hat{Q}_{1,i} + \omega_{p5} \quad \text{Eq. 4E}$$

$$\hat{Q}_{2,i+1} = \hat{Q}_{2,i} + \omega_{p6} \quad \text{Eq. 4F}$$

$$\hat{X}_{e,i+1} = \hat{X}_{e,i} + \omega_{p7} \quad \text{Eq. 4G}$$

where $\omega_{p1} - \omega_{p7}$ represent the corresponding process noise for the state equations 4A-4G.

The observation versions of these equations are:

$$0 = V_{1,i+1} - \hat{V}_{1,i+1} + \omega_{m1} \quad \text{Eq. 5A}$$

$$0 = V_{2,i+1} - \hat{V}_{2,i+1} + \omega_{m2} \quad \text{Eq. 5B}$$

$$0 = I_{1,i+1} - \hat{I}_{1,i+1} + \omega_{m3} \quad \text{Eq. 5C}$$

$$0 = I_{2,i+1} - \hat{I}_{2,i+1} + \omega_{m1} \quad \text{Eq. 5D}$$

$$0 = Q_{1,i+1} - \hat{Q}_{1,i+1} + \omega_{m5} \quad \text{Eq. 5E}$$

$$0 = Q_{2,i+1} - \hat{Q}_{2,i+1} + \omega_{m6} \quad \text{Eq. 5F}$$

$$0 = \hat{V}_{2,i+1}^2 - \hat{V}_{1,i+1}^2 - (\hat{Q}_{2,i-1} - \hat{Q}_{1,i+1})X_{e,i+1} + (\hat{I}_{2,i+1}^2 - \hat{I}_{1,i+1}^2)X_{e,i+1}^2 + \omega_7 \quad \text{Eq. 5G}$$

where $\omega_{m1} - \omega_{m7}$ represent the corresponding measurement noise for the state equations 5A-5G. These state equations allow for accurate tracking of the values of the characteristics of generator 102 and grid, while also accurately tracking the noise associated with the process and measuring the values.

Furthermore in the exemplary embodiment, the data is also monitored to distinguish a transient system event, such as a down power line, that affects the grid impedance from a data error. In the exemplary embodiment, this is accomplished with a Singular Value Decomposition approach. This approach consists of a factorization of a matrix that explicitly identifies and rank-orders matrix gains, while also identifying each direction of the corresponding gains. First a matrix consisting of (V, I, Q) measurements in time is generated. Then the matrix is factorized, which results in singular values. The singular values are stored and tracked. When a transient system event due to a change in the system occurs due to system conditions, such as a line or generator outage, this change is reflected in the singular values. The smallest singular value undergoes a large change in its magnitude whenever a transient system even occurs. However, if a large change in measurements it observed that is due to bad data, then no significant change in the singular values is observed. Therefore, tracking the smallest singular values of the measurement matrix, allows the system to identify whether a system event is a transient system event (due to a system change) or potentially bad data.

Figure 3:
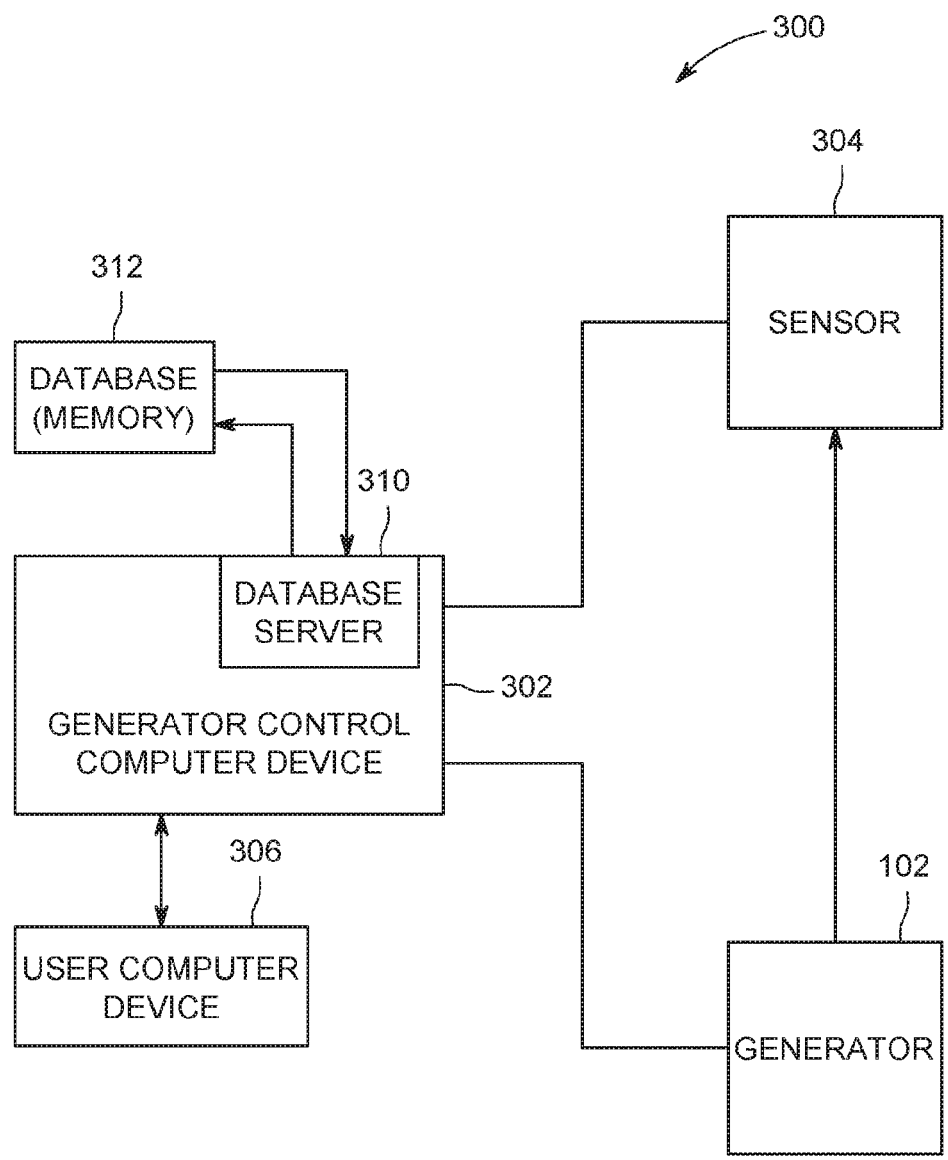
FIG. 3 is a schematic view of an exemplary generator control system to efficiently control the power system shown in FIG. 1.

FIG. 3 is a schematic view of an exemplary generator control system 300 for efficiently controlling power system 100 (shown in FIG. 1). In the exemplary embodiment, generator control system 300 is used for controlling and optimizing the operation of generator 102 (shown in FIG. 1). Generator control system 300 includes a generator control computer device 302 configured to determine the conditions of the grid and control generator 102 in accordance with current grid conditions. As described below in more detail, generator control computer device 302 is configured to receive, from one or more sensors 304, a plurality of sensor readings representing one or more conditions of generator 102. Generator control computer device 302 is also configured to calculate a current grid impedance of the grid based on the plurality of sensor readings. Generator control computer device 302 is further configured to determine a steady state stability limit for generator 102 based on the current grid impedance. In addition, generator control computer device 302 is configured to adjust operation of generator 102 based on the determined steady state stability limit.

In the exemplary embodiment, user computer devices 306 are computers or computer devices that include a web browser or a software application, which enables user computer devices 306 to access generator control computer device 302. More specifically, user computer devices 306 may be communicatively coupled to the generator control computer device 302 through various wired and wireless interfaces including, but not limited to, at least one of a network, such as the Internet, a local area network (LAN), a wide area network (WAN), or an integrated services digital network (ISDN), a dial-up-connection, a digital subscriber line (DSL), a cellular phone connection, and a cable modem. User computer devices 306 can be any device capable of accessing generator control computer device 302 including, but not limited to, a desktop computer, a laptop computer, a personal digital assistant (PDA), a cellular phone, a smartphone, a tablet, or other web-based connectable equipment.

Sensors 304 are adapted to measure a parameter of interest, such as electric voltage, current, active power, and reactive power. In the exemplary embodiment, sensors 304 are similar to sensors 108 (shown in FIG. 1). In the exemplary embodiment, sensors 304 are positioned at the terminals of generator 102 to measure the output of generator 102. In these embodiments, sensors 304 are positioned between generator 102 and power distribution network 104 (shown in FIG. 1). Sensors 304 are connected to generator control computer device 302 through many interfaces including without limitation a network, such as a local area network (LAN) or a wide area network (WAN), dial-in-connections, cable modems, Internet connection, wireless, and special high-speed Integrated Services Digital Network (ISDN) lines. Sensors 304 receive data about conditions of generator 102 and report those conditions at least to generator control computer device 302. In some embodiments, sensors 304 are also in communication with other computer systems, such as, but not limited to, user computer devices 306.

A database server 310 is coupled to a database 312, which contains information on a variety of matters, as described herein in greater detail. In one embodiment, centralized database 312 is stored on generator control computer device 302. In an alternative embodiment, database 312 is stored remotely from generator control computer device 302 and may be non-centralized. In some embodiments, database 312 includes a single database having separated sections or partitions or in other embodiments, database 312 includes multiple databases, each being separate from each other. In the exemplary embodiment, database 312 stores historical sensor data, one or more impedance trends, formula, and generator parameters. In some embodiments, a user is able to access database 312 by logging into generator control computer device 302, such as through user computer device 306.

Generator control computer device 302 is a computer device that includes a web browser or a software application, which enables generator control computer device 302 to communicate with sensors 304 and generator 102. Generator control computer device 302 is communicatively coupled to sensors 304 and generator 102 through various wired and wireless interfaces including, but not limited to, at least one of a network, such as the Internet, a local area network (LAN), a wide area network (WAN), or an integrated services digital network (ISDN), a dial-up-connection, a digital subscriber line (DSL), a cellular phone connection, and a cable modem. Generator control computer device 302 can be any device capable of receiving sensor data, performing calculations, and transmitting instructions to generator 102 including, but not limited to, a desktop computer, a laptop computer, a personal digital assistant (PDA), a cellular phone, a smartphone, a tablet, or other web-based connectable equipment. In some embodiments, generator control computer device 302 is in direct control of generator 102. In other embodiments, generator control computer device 302 is in communication with a separate computer device that is in control of generator 102. In these embodiments, generator control computer device 302 transmits instructions or desired operating parameters to the separate computer device.

Figure 4:
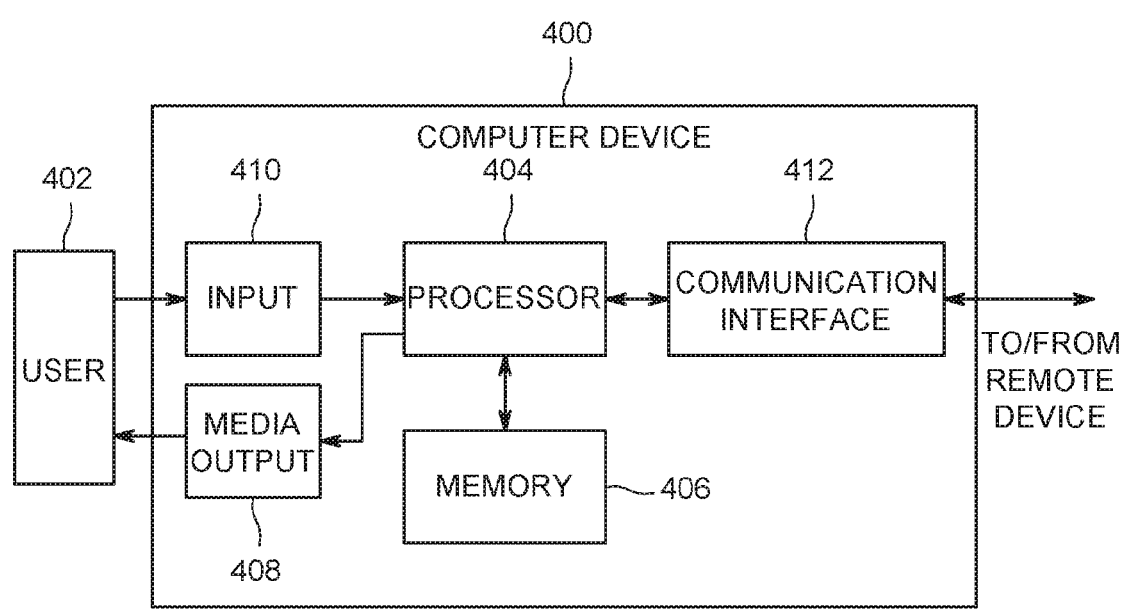
FIG. 4 is a schematic view of an exemplary configuration of a computer device that may be used with the generator control system shown in FIG. 3.

FIG. 4 is a schematic view of an exemplary configuration of a computer device 400 that may be used with generator control system 300 (shown in FIG. 3). Computer device 400 is operated by a user 402. Computer device 400 may include, but is not limited to, generator 102, sensor 304, and user computer device 306 (all shown in FIG. 3). Computer device 400 includes a processor 404 for executing instructions. In some embodiments, executable instructions are stored in a memory area 406. Processor 404 may include one or more processing units (e.g., in a multi-core configuration). Memory area 406 is any device allowing information such as executable instructions and/or transaction data to be stored and retrieved. Memory area 406 includes one or more computer readable media. In some embodiments, memory area 406 includes database 312 (shown in FIG. 3). In some embodiments, memory area 406 is stored in computer device 400. In alternative embodiments, memory area 406 is stored remotely from computer device 400.

Computer device 400 also includes at least one media output component 408 for presenting information to user 402. Media output component 408 is any component capable of conveying information to user 402. In some embodiments, media output component 408 includes an output adapter (not shown) such as a video adapter and/or an audio adapter. An output adapter is operatively coupled to processor 404 and operatively coupled to an output device such as a display device (e.g., a cathode ray tube (CRT), liquid crystal display (LCD), light emitting diode (LED) display, or "electronic ink" display) or an audio output device (e.g., a speaker or headphones). In some embodiments, media output component 408 is configured to present a graphical user interface (e.g., a web browser and/or a client application) to user 402. In some embodiments, computer device 400 includes an input device 410 for receiving input from user 402. User 402 may use input device 410 to, without limitation, update parameters about generator 102. Input device 410 may include, for example, a keyboard, a pointing device, a mouse, a stylus, a touch sensitive panel (e.g., a touch pad or a touch screen), a gyroscope, an accelerometer, a position detector, a biometric input device, and/or an audio input device. A single component such as a touch screen may function as both an output device of media output component 408 and input device 410.

Computer device 400 may also include a communication interface 412, communicatively coupled to a remote device such as generator control computer device 302 (shown in FIG. 3). Communication interface 412 may include, for example, a wired or wireless network adapter and/or a wireless data transceiver for use with a mobile telecommunications network or a local area network.

Stored in memory area 406 are, for example, computer readable instructions for providing a user interface to user 402 via media output component 408 and, optionally, receiving and processing input from input device 410. A user interface may include, among other possibilities, a web browser and/or a client application. Web browsers enable users, such as user 402, to display and interact with media and other information typically embedded on a web page or a website. A client application allows user 402 to interact with, for example, generator control computer device 302. For example, instructions may be stored by a cloud service, and the output of the execution of the instructions sent to the media output component 408.

Processor 404 executes computer-executable instructions for implementing aspects of the disclosure. In some embodiments, processor 404 is transformed into a special purpose microprocessor by executing computer-executable instructions or by otherwise being programmed. For example, processor 404 is programmed with instructions discussed further below.

Figure 5:
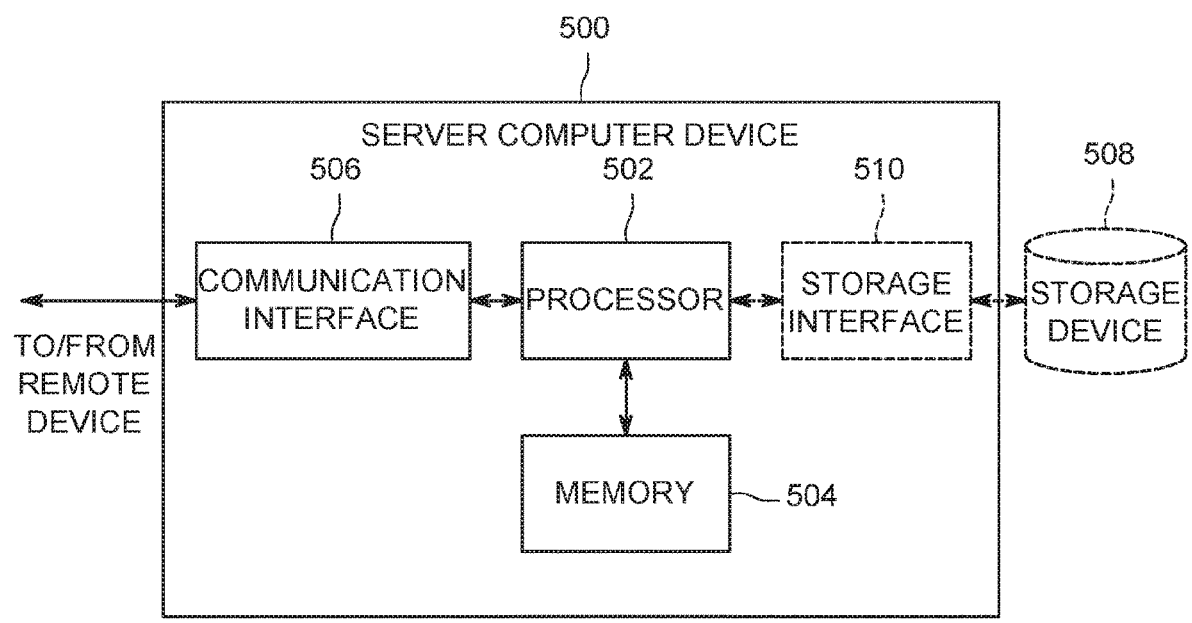
FIG. 5 is a schematic view of an exemplary configuration of configuration of a server computer device used to implement the generator control system shown in FIG. 3.

FIG. 5 is a schematic view of an exemplary configuration of a server computer device 500 used to implement generator control system 300 (shown in FIG. 3). More specifically, server computer device 500 may include, but is not limited to, generator control computer device 302 and database server 310 (both shown in FIG. 3). Server computer device 500 also includes a processor 502 for executing instructions. Instructions may be stored in a memory area 504. Processor 502 may include one or more processing units (e.g., in a multi-core configuration).

Processor 502 is operatively coupled to a communication interface 506 such that server computer device 500 is capable of communicating with a remote device, such as another server computer device 500, generator control computer device 302, generator 102, sensors 304, or user computer devices 306 (all shown in FIG. 3). For example, communication interface 506 may receive requests from user computer device 306, as illustrated in FIG. 3.

Processor 502 is also operatively coupled to a storage device 508. Storage device 508 is any computer-operated hardware suitable for storing and/or retrieving data, such as, but not limited to, data associated with database 312 (shown in FIG. 3). In some embodiments, storage device 508 is integrated in server computer device 500. For example, server computer device 500 may include one or more hard disk drives as storage device 508. In other embodiments, storage device 508 is external to server computer device 500 and is accessed by a plurality of server computer device 500. For example, storage device 508 may include a storage area network (SAN), a network attached storage (NAS) system, and/or multiple storage units such as hard disks and/or solid state disks in a redundant array of inexpensive disks (RAID) configuration.

In some embodiments, processor 502 is operatively coupled to storage device 508 via a storage interface 510. Storage interface 510 is any component capable of providing processor 502 with access to storage device 508. Storage interface 510 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 502 with access to storage device 508.

Processor 502 executes computer-executable instructions for implementing aspects of the disclosure. In some embodiments, the processor 502 is transformed into a special purpose microprocessor by executing computer-executable instructions or by otherwise being programmed. For example, the processor 502 is programmed with instructions as described further below.

Figure 6:
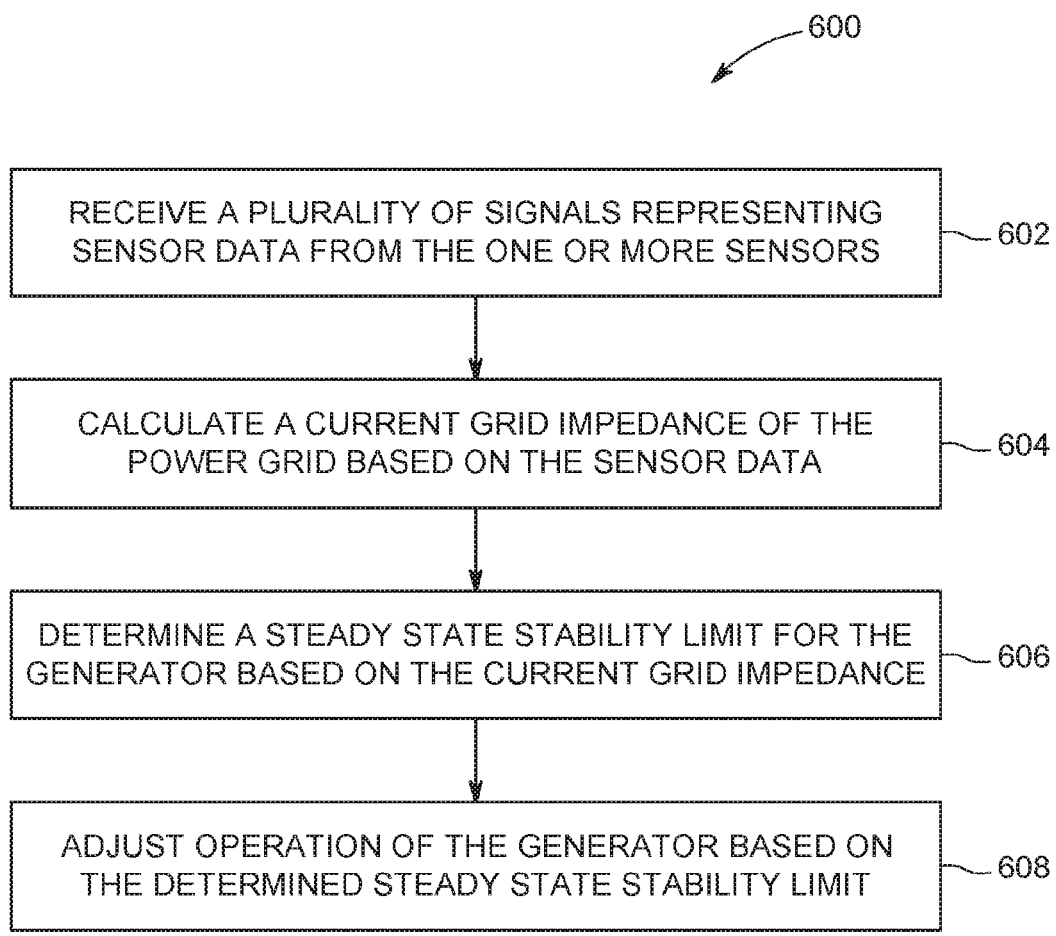
FIG. 6 is a flow chart of an exemplary process of efficiently controlling the power system shown in FIG. 1 using the power generation system shown in FIG. 3.

FIG. 6 is a flow chart of an exemplary process 600 of efficiently controlling power system 100 (shown in FIG. 1) using generator control system 300 (shown in FIG. 3). In the exemplary embodiment, process 600 is performed by generator control computer device 302 (shown in FIG. 3).

In the exemplary embodiment, generator control computer device 302 receives 602 a plurality of signals representing sensor data from sensors 304 (shown in FIG. 3). In the exemplary embodiment, sensors 304 take readings of the conditions of generator 102 (shown in FIG. 1) on a repeated periodic basis, such as once every tenth of a second. In the exemplary embodiments, sensors readings include, but are not limited to, voltage, active power, reactive power, and current. In some embodiments, generator control computer device 302 transmits a request for the sensor readings to sensors 304. In other embodiments, sensors 304 transmit the sensor readings without being prompted by generator control computer device 302.

Generator control computer device 302 calculates 604 a current grid impedance of the power grid based on the sensor data. In the exemplary embodiment, generator control computer device 302 calculates 604 a current grid impedance $X_{e,1+1}$ using equations 5A-5G. Accordingly, generator control computer device 302 solves equations 4A-4G to determine values for the state variables and process noise variables. Then generator control computer device 302 inputs current received sensor data into equations 5A-5G to solve for current grid impedance.

Generator control computer device 302 determines 606 a steady state stability limit 210 (shown in FIG. 2) for generator 102 based on the current grid impedance. If there is no non-negligible change in current grid impedance from the previous measurement, then steady state stability limit 210 remains the same. If the grid impedance increases, then generator control computer device 302 moves the steady state stability limit 210 in from reactive power curve 206. If the grid impedance decreases, then generator control computer device 302 moves the steady state stability limit 210 out towards reactive power curve 206. For example, generator control computer device 302 may move the steady state stability limit 210 away from reactive power curve 206 if a transient system event occurs, like a power line outage. Generator control computer device 302 may then move the steady state stability limit 210 back towards reactive power curve when the transient system event is resolved.

Generator control computer device 302 adjusts 608 operation of generator 102 based on the determined steady state stability limit 210. In the exemplary embodiment, generator control computer device 302 operates generator 102 at the steady state stability limit 210, so that the maximum safe amount of output is always in use. As the steady state stability limit 210 moves away from the reactive power curve 206, generator control computer device 302 reduces the output of generator 102 to maintain safe operation. As the steady state stability limit 210 moves toward the reactive power curve 206, generator control computer device 302 increases the output of generator 102 to maintain maximum safe output.

In some embodiments, generator control computer device 302 determines one or more noise characteristics, such as $\omega_{p1}-\omega_7$ and/or $\omega_{m1}-\omega_{m7}$, of the current grid impedance based on the plurality of sensor readings. In these embodiments, generator control computer device 302 adjusts the current grid impedance to account for these noise characteristics.

In some further embodiments, generator control computer device 302 stores a plurality of values for current grid impedance and stores the plurality of sensor readings, such as in database 312 (shown in FIG. 3). Generator control computer device 302 calculates one or more trends of current grid impedance based on the plurality of stored values. These trends may be transmitted to one or more user computer devices 306 (shown in FIG. 3). Generator control computer device 302 may also use these trends to determine or recognize operating conditions of generator 102.

In some of these embodiments, after a transient event, generator control computer device 302 delays changing steady state stability limit 210 until power system 100 (shown in FIG. 1) has returned to a steady state. In these embodiments, generator control computer device 302 calculates 604 and stores values for grid impedance at a plurality of points in time. Generator control computer device 302 generates one or more trends based on the stored grid impedance values. Based on the one or more trends, generator control computer device 302 determines that the transient event is over and that power system 100 has returned to a steady state. Then generator control computer device 302 calculates a final grid impedance and determines steady state stability limit 210 based on the final grid impedance. For example, when a transient event occurs, generator control computer device 302 lowers steady state stability limit 210 and reduces the output of generator 102 accordingly. While generator control computer device 302 waits for power system 100 to stabilize after the transient event, steady state stability limit 210 remains the same. Once power system 100 stabilizes, generator control computer device 302 raises steady state stability limit 210 and correspondingly generator 102 output based on the new grid impedance.

In some still further embodiments, generator control computer device 302 detects an event based on the plurality of sensor readings, where the event is a significant change in sensor values. Generator control computer device 302 determines whether the event is a transient event, where the event is associated with a change in the grid impedance, such as a line outage. If generator control computer device 302 determines the event is a transient event, generator control computer device 302 calculates the grid impedance to include the sensor readings associated with the event. If generator control computer device 302 determines the event is not a transient event, generator control computer device 302 excludes the sensor readings associated with the event from the calculation of the grid impedance. An example method for performing this operation is the Singular Value Decomposition approach.

For each of a plurality of points in time, generator control computer device 302 generates a matrix based on the plurality of sensor readings. Generator control computer device 302 performs a factorization of the matrix to generate a result. Generator control computer device 302 stores the result of the factorization and generates a trend based on the plurality of stored results, such as in database 312. Generator control computer device 302 uses this trend to recognize whether the event is a transient event.

The above-described method and systems facilitate safely and efficiently operating a generator attached to a power grid. Specifically, the embodiments described herein include a computing device that is configured to monitor the impedance of the grid that the generator is attached to and adjust the operation of the generator based on changes in the monitored impedance. The computing device may use a plurality of methods for determining the impedance, correcting for noise, and detecting data errors. In the exemplary embodiment, the computer device performs in real-time, correcting for current changes in the make-up of the grid to prevent potential issues with the generator and providing the maximum output available.

An exemplary technical effect of the methods, systems, and apparatus described herein includes at least one of: (a) constantly monitoring the impedance of a power grid based on generator output; (b) adjusting the operation of a generator to correct for changes in impedance on a power grid; (c) maximizing output of a generator; (d) preventing catastrophic failure of a generator due to impedance changes, (e) correcting for noise in impedance measurements; (f) detecting and compensating for transient events; and (g) detecting and compensating for data errors.

Exemplary embodiments of methods, systems, and apparatus for securely executing models are not limited to the specific embodiments described herein, but rather, components of systems and/or steps of the methods may be utilized independently and separately from other components and/or steps described herein. For example, the methods may also be used in combination with other generator and power systems, and are not limited to practice with only the systems and methods as described herein. Rather, the exemplary embodiment can be implemented and utilized in connection with many other applications, equipment, and systems that may benefit from real-time impedance monitoring.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A generator control computer device for operating at least one generator attached to a grid, said generator control computer device comprising at least one processor in communication with at least one memory device, said generator control computer device configured to:
   store a previous steady state stability limit for the at least one generator;
   receive, from at least one sensor, a plurality of real-time sensor readings representing one or more conditions of the at least one generator;
   calculate, in real-time, a current grid impedance of the grid based on the plurality of real-time sensor readings;
   determine a steady state stability limit for the at least one generator based on the current grid impedance;
   compare the steady state stability limit to the previous steady state stability limit and
   if there is a difference between the steady state stability limit and the previous steady state stability limit, adjust operation of the at least one generator to operate at the determined steady state stability limit.

2. A generator control computer device in accordance with claim 1, wherein said generator control computer device is further configured to:
   determine one or more noise characteristics of the current grid impedance based on the plurality of real-time sensor readings; and
   adjust the current grid impedance based on the one or more noise characteristics.

3. A generator control computer device in accordance with claim 1, wherein said generator control computer device is further configured to:
   store a plurality of values for current grid impedance at a plurality of points in time based on a plurality of real-time sensor readings at the plurality of points in time;
   calculate one or more trends of current grid impedance based on the plurality of stored values, calculate a final grid impedance based on the one or more trends; and
   determine the steady state stability limit based on the final grid impedance.

4. A generator control computer device in accordance with claim 1, wherein said generator control computer device is further configured to:
   detect an event based on the plurality of real-time sensor readings;
   determine whether the event is a transient event; and
   if the determination is that the event is a transient event, calculate the current grid impedance to include the sensor readings associated with the event.

5. A generator control computer device in accordance with claim 4, wherein said generator control computer device is further configured to exclude the sensor readings associated with the event from the calculation of the current grid impedance if the determination is that the event is not a transient event.

6. A generator control computer device in accordance with claim 4, wherein said generator control computer device is further configured to:
   for each of a plurality of points in time, generate a matrix based on the plurality of real-time sensor readings;
   perform a factorization of each matrix to generate a result;
   store the result of the factorizations in the memory device; and
   generate a trend based on the plurality of stored results.

7. A generator control computer device in accordance with claim 1, wherein the at least one sensor measures at least one of terminal voltage, reactive power, active power, and current.

8. A generator control computer device in accordance with claim 1, wherein said generator control computer device is further configured to increase output of the at least one generator if the steady state stability limit increased, wherein the output is increased based on the steady state stability limit and a reactive power curve associated with the at least one generator.

9. A generator control computer device in accordance with claim 1, wherein said generator control computer device is further configured to reduce output of the at least one generator if the steady state stability limit decreased, wherein the output is reduced based on the steady state stability limit and a reactive power curve associated with the at least one generator.

10. A system comprising:
    a generator configured to generate electrical energy, wherein said generator is connected to and provides the generated electrical energy to a power grid;
    at least one sensor configured to monitor, in real-time, at least one condition of said generator and generate signals representing sensor data based on the at least one condition; and
    a generator control computer device comprising a processor and a memory, said generator control computer device in communication with said at least one sensor, said generator control computer device configured to control operation of said generator, thereby controlling flow of electrical energy to the power grid, said generator control computer device configured to:
        store a previous steady state stability limit for said generator;
        receive a plurality of signals representing real-time sensor data from said at least one sensor;
        calculate a current grid impedance of the power grid based on the real-time sensor data;
        determine a steady state stability limit for said generator based on the current grid impedance;
        compare the steady state stability limit to the previous steady state stability limit; and if there is a difference between the steady state stability limit and the previous steady state stability limit, adjust operation of said generator to operate at the determined steady state stability limit.

11. A system in accordance with claim 10, wherein said generator control computer device is further configured to:
   determine one or more noise characteristics of the current grid impedance based on the real-time sensor data; and
   adjust the current grid impedance based on the one or more noise characteristics.

12. A system in accordance with claim 10, wherein said generator control computer device is further configured to:
   store a plurality of values for current grid impedance at a plurality of points in time based on a plurality of real-time sensor readings;
   calculate one or more trends of current grid impedance based on the plurality of stored values;
   calculate a final grid impedance based on the one or more trends; and
   determine the steady state stability limit based on the final grid impedance.

13. A system in accordance with claim 10, wherein said generator control computer device is further configured to:
   detect an event based on the real-time sensor data;
   determine whether the event is a transient event; and
   if the determination is that the event is a transient event, calculate the current grid impedance to include the sensor data associated with the event.

14. A system in accordance with claim 13, wherein said generator control computer device is further configured to exclude the sensor data associated with the event from the calculation of the current grid impedance if the determination is that the event is not a transient event.

15. A system in accordance with claim 13, wherein said generator control computer device is further configured to:
   for each of a plurality of points in time, generate a matrix based on the real-time sensor data;
   perform a factorization of each matrix to generate a plurality of results;
   store the plurality of results of the factorizations in said memory; and
   generate a trend based on the plurality of stored results.

16. A system in accordance with claim 10, wherein said at least one sensor measures at least one of terminal voltage, reactive power, active power, and current.

17. A system in accordance with claim 10, wherein said generator control computer device is further configured to:
   increase output of said generator if the steady state stability limit increased, wherein the output is increased based on the steady state stability limit and a reactive power curve associated with the generator; and
   reduce output of said generator if the steady state stability limit decreased, wherein the output is reduced based on the steady state stability limit and the reactive power curve.

18. A method for operating at least one generator attached to a grid, said method implemented using a generator control computer device that includes a processor in communication with a memory, said method comprising:
   storing a previous steady state stability limit for the at least one generator;
   receiving, from at least one sensor, a plurality of real-time sensor readings representing one or more conditions of the at least one generator;
   calculating, by the processor, a current grid impedance of the grid based on the plurality of real-time sensor readings;
   determining, by the processor, a steady state stability limit for the at least one generator based on the current grid impedance;
   comparing the steady state stability limit to the previous steady state stability limit; and
   if there is a difference between the steady state stability limit and the previous steady state stability limit, adjusting, by the processor, operation of the at least one generator to operate at the determined steady state stability limit.

19. A method in accordance with claim 18, further comprising:
   determining one or more noise characteristics of the current grid impedance based on the plurality of real-time sensor readings; and
   adjusting the current grid impedance based on the one or more noise characteristics.

20. A method in accordance with claim 18, further comprising:
   for each of a plurality of points in time, generating a matrix based on the plurality of real-time sensor readings;
   performing a factorization of each matrix to generate a plurality of results;
   storing the plurality of results of the factorizations in the memory;
   generating a trend based on the plurality of stored results;
   detecting an event based on the trend;
   determining whether the event is a transient event;
   if the determination is that the event is a transient event, calculating the current grid impedance based on the plurality of real-time sensor readings associated with the event; and
   if the determination is that the event is not a transient event, excluding the plurality of real-time sensor readings associated with the event from the calculation of the current grid impedance.

\* \* \* \* \*